United States Patent
Tanaka et al.

(10) Patent No.: US 12,050,484 B2
(45) Date of Patent: Jul. 30, 2024

(54) CLOCK GENERATION CIRCUIT

(71) Applicant: Nippon Telegraph and Telephone Corporation, Tokyo (JP)

(72) Inventors: Kenji Tanaka, Tokyo (JP); Naoki Miura, Tokyo (JP); Shinsuke Nakano, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 863 days.

(21) Appl. No.: 17/051,637

(22) PCT Filed: Apr. 17, 2019

(86) PCT No.: PCT/JP2019/016460
§ 371 (c)(1),
(2) Date: Oct. 29, 2020

(87) PCT Pub. No.: WO2019/211979
PCT Pub. Date: Nov. 7, 2019

(65) Prior Publication Data
US 2021/0216097 A1    Jul. 15, 2021

(30) Foreign Application Priority Data
May 1, 2018    (JP) ................. 2018-088014

(51) Int. Cl.
*G06F 1/10*    (2006.01)
*G06F 1/06*    (2006.01)
(Continued)

(52) U.S. Cl.
CPC .............. *G06F 1/10* (2013.01); *G06F 1/06* (2013.01); *H03F 3/08* (2013.01); *H03F 1/223* (2013.01); *H03F 3/082* (2013.01); *H03K 3/42* (2013.01)

(58) Field of Classification Search
CPC ... G06F 1/06; G06F 1/10; H03F 1/223; H03F 3/08; H03F 3/082; H03K 3/42
See application file for complete search history.

(56) References Cited

U.S. PATENT DOCUMENTS

| 6,972,880 B1 | 12/2005 | Kanesaka |
| 8,548,331 B1 * | 10/2013 | Zanoni ................. H04B 10/90 398/115 |

(Continued)

FOREIGN PATENT DOCUMENTS

| JP | H09233030 A | 9/1997 |
| JP | 2004282693 A | 10/2004 |
| JP | 2007251365 A | 9/2007 |

OTHER PUBLICATIONS

Hjelme et al., "Theory of timing jitter in actively mode-lockedlasers," IEEE Journal of Quantum Electronics, vol. 28, No. 6, Jun. 1992, pp. 1594-1606.

(Continued)

*Primary Examiner* — Terrell S Johnson
(74) *Attorney, Agent, or Firm* — Slater Matsil, LLP

(57) ABSTRACT

A clock generation circuit includes a mode-locked laser that generates an optical pulse, a photodiode that photoelectrically converts the optical pulse generated by the mode-locked laser, and a filter that attenuates at least one of a DC component and a harmonic component of the mode-locked laser included in an electric signal output from the photodiode.

5 Claims, 13 Drawing Sheets

(51) Int. Cl.
*H03F 1/22* (2006.01)
*H03F 3/08* (2006.01)
*H03K 3/42* (2006.01)

(56) References Cited

U.S. PATENT DOCUMENTS

| | | | |
|---|---|---|---|
| 2004/0141172 A1* | 7/2004 | Davidson | H04B 10/07951 356/73.1 |
| 2007/0134002 A1* | 6/2007 | Arahira | G04F 5/14 398/155 |
| 2009/0174931 A1* | 7/2009 | Huber | H01S 3/06791 372/18 |
| 2021/0216097 A1* | 7/2021 | Tanaka | H03K 3/42 |

OTHER PUBLICATIONS

Krueger et al., " A monolithically integrated opto-electronic clockconverter in photonic SiGe-BiCMOS technology," 2015 IEEE Bipolar/BiCMOSCircuits and Technology Meeting, Oct. 26, 2015, 4 pages.

* cited by examiner

CLOCK GENERATION CIRCUIT

CROSS-REFERENCE TO RELATED APPLICATIONS

This application is a national phase entry of PCT Application No. PCT/JP2019/016460, filed on Apr. 17, 2019, which claims priority to Japanese Application No. 2018-088014, filed on May 1, 2018, which applications are hereby incorporated herein by reference.

TECHNICAL FIELD

The present invention relates to a circuit configuration that reduces jitter superimposed on a clock signal in a clock generation circuit.

BACKGROUND

The clock signal is an electric signal necessary for the operation of analog circuits and digital circuits. Fluctuation in time (jitter) of the clock signal adversely affects the operation of the circuits. To cite an example, if clock jitter of an analog-digital conversion circuit doubles, the SN ratio of an output signal of the analog-digital conversion circuit deteriorates by −6 dB. Because of such a background, a low-jitter clock signal is drawing attention in the electronic circuit field.

A general clock generation circuit includes a signal source 100 that outputs a frequency reference signal and a shaping circuit 101 that shapes the reference signal into a sine wave or a rectangular wave, as shown in FIG. 29. As a current system, there is a case where a mode-locked laser (MLL) is used for a signal source (see Non-Patent Literature 1). The MLL outputs an optical pulse by a nonlinear optical effect. If pulse width of the optical pulse is 0, the MLL outputs only a pulse of a repetition frequency, a DC component, and a harmonic component, so ideally, jitter of a clock signal output from the shaping circuit 101 becomes 0.

Non-Patent Literature 1 discloses a clock generation circuit composed of, in addition to an MLL 200 serving as a signal source, a PD (Photo-Diode) 201 serving as a photodetector, and an RS flip-flop (FF) 202 serving as a shaping circuit. In the clock generation circuit, the broadband PD 201 converts an optical pulse from the MLL 200 into an electric pulse, and the electric pulse drives, as a trigger signal, the FF 202, which in turn generates a rectangular wave clock signal. Specifically, the electric pulse output from the PD 201 is converted into a differential pulse in an electric circuit, and the differential pulse drives the FF 202. At this time, jitter becomes 0 if the pulse width is an ideal state of 0.

The technique disclosed in Non-Patent Literature 1 is based on the premise that an infinitely narrow optical pulse is generated from the MLL 200. However, as the pulse width of light becomes narrower, the peak intensity of the light becomes stronger, and in reality, it becomes difficult for the PD 201 to receive the light. Therefore, it is necessary to make the pulse width of light wide to some extent, but if the pulse width is made wide, a phase noise other than the repetition frequency, the DC component, and the harmonic component is generated in the spectrum of the optical pulse. It is known that the phase noise has the DC component and the harmonic component larger than the repetition frequency (see Non-Patent Literature 2). The technique disclosed in Non-Patent Literature 1 has a problem that jitter is generated because the clock signal is shaped without removing the phase noise.

CITATION LIST

Non-Patent Literature

Non-Patent Literature 1: B. Krueger et al., "A monolithically integrated opto-electronic clock converter in photonic SiGe-BiCMOS technology", 2015 IEEE Bipolar/BiCMOS Circuits and Technology Meeting—BCTM, Boston, M A, 2015, pp. 129-132

Non-Patent Literature 2: D. R. Hjelme and A. R. Mickelson, "Theory of timing jitter in actively mode-locked lasers", in IEEE Journal of Quantum Electronics, vol. 28, no. 6, pp. 1594-1606, June 1992.

SUMMARY

Technical Problem

Embodiments of the present invention have been made to solve the above problem, and an object of embodiments of the present invention is to provide a clock generation circuit capable of reducing jitter superimposed on a clock signal.

Means for Solving the Problem

A clock generation circuit of embodiments of the present invention includes a mode-locked laser that generates an optical pulse, a photodetector that photoelectrically converts the optical pulse generated by the mode-locked laser; and a filter that attenuates at least one of a DC component and a harmonic component of the mode-locked laser included in an electric signal output from the photodetector.

In a configuration example of the clock generation circuit of embodiments of the present invention, the filter attenuates both of the DC component and the harmonic component, and the clock generation circuit further includes an amplifier that is provided at an output of the filter or between the photodetector and the filter and amplifies a signal.

Alternatively, a clock generation circuit of embodiments of the present invention includes a mode-locked laser that generates an optical pulse, a photodetector that photoelectrically converts the optical pulse generated by the mode-locked laser, and an amplifier that amplifies an electric signal output from the photodetector, wherein a cutoff frequency on a lower band side of the amplifier is higher than a frequency of a DC component of the mode-locked laser included in the output signal of the photodetector, and a cutoff frequency on a higher band side of the amplifier is lower than a frequency of a harmonic component of the mode-locked laser included in the output signal of the photodetector.

A configuration example of the clock generation circuit of embodiments of the present invention further includes a first matching circuit that is inserted between an output terminal of the photodetector and an input terminal of the amplifier and matches impedance of the photodetector and the amplifier at a repetition frequency of the mode-locked laser, and a second matching circuit that is inserted between an output terminal of the amplifier and an input terminal of a subsequent circuit connected to the amplifier and matches impedance of the amplifier and the subsequent circuit at the repetition frequency of the mode-locked laser.

In a configuration example of the clock generation circuit of embodiments of the present invention, each of the first and second matching circuits includes at least one of: a first series resonator that includes at least a series circuit composed of an inductor and a capacitor inserted in series into a signal line, and has a resonance frequency set to the repetition frequency of the mode-locked laser; a second series resonator that includes at least a series circuit composed of an inductor and a capacitor inserted between the signal line and a negative power supply line, and has a resonance frequency set to the frequency of the harmonic component of the mode-locked laser; a first parallel resonator that includes at least a parallel circuit composed of an inductor inserted in series into the signal line and a capacitor connected in parallel with the inductor, and has a resonance frequency set to either the frequency of the DC component or the frequency of the harmonic component of the mode-locked laser, and a second parallel resonator that includes at least a parallel circuit composed of an inductor inserted between the signal line and the negative power supply line and a capacitor connected in parallel with the inductor, and has a resonance frequency set to the repetition frequency of the mode-locked laser.

In a configuration example of the clock generation circuit of embodiments of the present invention, the amplifier includes at least one of: a first parallel resonator that includes at least a parallel circuit composed of an inductor inserted between a positive power supply line and an input signal line and a capacitor connected in parallel with the inductor, and has a resonance frequency set to the repetition frequency of the mode-locked laser; a second parallel resonator that includes at least a parallel circuit composed of an inductor inserted between the positive power supply line and a positive power supply terminal of the amplifier and a capacitor connected in parallel with the inductor, and has a resonance frequency set to the frequency of the harmonic component of the mode-locked laser, and a third parallel resonator that includes at least a parallel circuit composed of an inductor inserted between a negative power supply terminal of the amplifier and a negative power supply line and a capacitor connected in parallel with the inductor, and has a resonance frequency set to the frequency of the harmonic component of the mode-locked laser.

In a configuration example of the clock generation circuit of embodiments of the present invention, a laminated inductor is used instead of the parallel circuit.

In a configuration example of the clock generation circuit of embodiments of the present invention, the amplifier includes a frequency peaking circuit having a center frequency set to the repetition frequency of the mode-locked laser.

Effects of Embodiments of the Invention

According to embodiments of the present invention, it is possible to reduce jitter of a clock signal by providing a mode-locked laser, a photodetector, and a filter that attenuates at least one of a DC component and a harmonic component of the mode-locked laser included in an electric signal output from the photodetector.

In embodiments of the present invention, it is possible to further reduce jitter of the clock signal by attenuating both of the DC component and the harmonic component by a filter and further providing an amplifier at an output of the filter or between the photodetector and the filter.

In embodiments of the present invention, it is possible to reduce jitter of a clock signal by providing a mode-locked laser, a photodetector, and an amplifier, and by setting a cutoff frequency on a lower band side of the amplifier higher than a frequency of a DC component of the mode-locked laser included in an output signal of the photodetector, and a cutoff frequency on a higher band side of the amplifier lower than a frequency of a harmonic component of the mode-locked laser included in the output signal of the photodetector.

In embodiments of the present invention, it is possible to further reduce jitter of the clock signal by providing a first matching circuit and a second matching circuit.

In embodiments of the present invention, it is possible to more strongly attenuate an unnecessary frequency component included in the clock signal by providing each of the first and second matching circuits with at least one of a first series resonator, a second series resonator, a first parallel resonator, and a second parallel resonator.

In embodiments of the present invention, it is possible to more strongly attenuate the unnecessary frequency component included in the clock signal by providing the amplifier with at least one of a first parallel resonator, a second parallel resonator, and a third parallel resonator.

In embodiments of the present invention, it is possible to perform space saving implementation by using a laminated inductor instead of the parallel circuit composed of an inductor and a capacitor.

In embodiments of the present invention, it is possible to reduce jitter of a clock signal output from the amplifier by providing the amplifier with a frequency peaking circuit.

DETAILED DESCRIPTION OF ILLUSTRATIVE EMBODIMENTS

Principle of Embodiments of Invention

Figure 1:
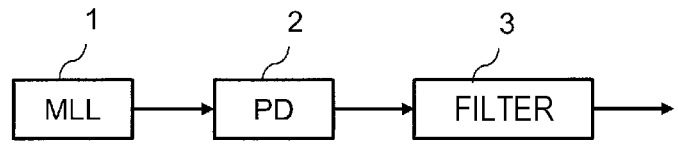
FIG. 1 is a block diagram illustrating an outline of a configuration of a clock generation circuit of embodiments of the present invention.

FIG. 1 is a block diagram showing an outline of a configuration of a clock generation circuit of embodiments of the present invention. In embodiments of the present invention, a broadband PD 2 photoelectrically converts an optical pulse generated by an MLL 1, a waveform of an electric pulse output from the PD 2 is shaped by a filter 3, and an SN ratio is improved. The filter 3 is a passive filter composed of only passive elements, or an active filter composed of passive elements and active elements.

In embodiments of the present invention, by a configuration like FIG. 1, a DC component and a harmonic component included in an output of the MLL 1 are removed, a repetition frequency component is amplified, and an SN ratio is improved. An output of the filter 3 is a sine wave clock signal.

Since jitter of the sine wave clock signal is determined by an SN ratio and a frequency of the signal, it is possible to reduce jitter by amplifying the repetition frequency component and removing the DC component and the harmonic component like embodiments of the present invention.

Figure 2:
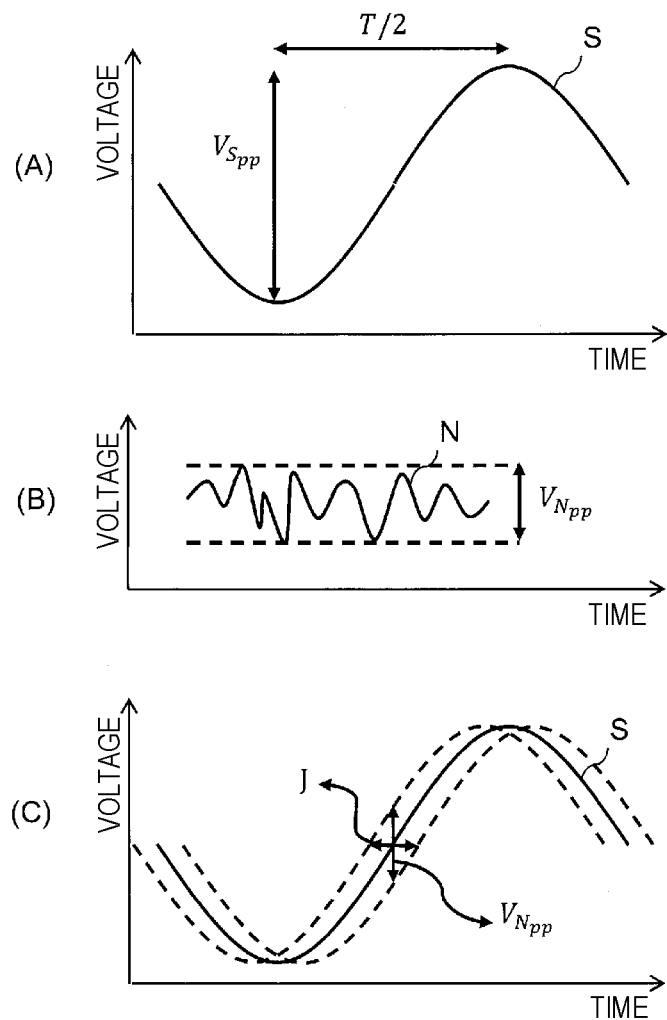
FIG. 2 is a diagram illustrating a relationship between jitter of a sine wave clock signal and an SN ratio in the clock generation circuit.

Here, a relationship between the jitter of the sine wave clock signal and the SN ratio will be described. When a noise N having a voltage amplitude $V_{Npp}$ as shown in FIG. 2(B) is superimposed on a sine wave clock signal S having a voltage amplitude $V_{Spp}$ and a signal cycle T as shown in FIG. 2(A), a jitter J as shown in FIG. 2(C) is generated in the sine wave clock signal S.

Assuming that signal component intensity is $P_S$, noise component intensity $P_N$, a voltage effective value of the sine wave clock signal S is $V_{Srms}$, and a voltage effective value of the noise N is $V_{Nrms}$, an SN ratio SNR and a slew rate THR can be expressed as the following formulas.

Formula 1

$$SNR = \frac{P_S}{P_N} = \left(\frac{V_{Srms}}{V_{Nrms}}\right)^2 = \left(\frac{V_{srms}}{V_{Nrms}}\right)^2 \propto \frac{V_{Spp}}{V_{Npp}} \quad (1)$$

$$THF = \frac{V_{Spp}}{T/2} \quad (2)$$

When the sine wave clock signal S and the noise N do not interact with each other, the jitter J can be expressed as the following formula.

Formula 2

$$J \cong \frac{V_{Npp}}{THF} = V_{Npp}\frac{T/2}{V_{Spp}} = SNR \times T/2 \quad (3)$$

In this way, it is understood that the jitter J of the sine wave clock signal S is determined by the SNR and the frequency of the signal.

Note that in the clock generation circuit of embodiments of the present invention, a narrow-band amplifier may be used instead of the filter 3 shown in FIG. 1.

First Example

Figure 3:
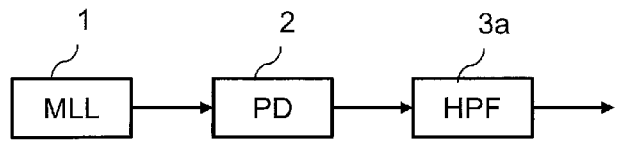
FIG. 3 is a block diagram showing a configuration of a clock generation circuit according to a first example of the present invention.

Hereinafter, examples of the present invention will be described with reference to the drawings. FIG. 3 is a block diagram showing a configuration of a clock generation circuit according to a first example of the present invention. The clock generation circuit of the example includes an MLL 1, a PD 2 serving as a photodetector that photoelectrically converts an optical pulse generated by the MLL 1, and a high-pass filter (HPF) 3a that high-pass filters an electric pulse output from the PD 2.

In the example, a cutoff frequency of the HPF 3a is set to a repetition frequency of the MLL 1 so that a DC component included in the output of the MLL 1 is not superimposed on a clock signal output from the HPF 3a.

The DC component of the output of the MLL 1 has a large intensity. Therefore, a low frequency noise in the vicinity of the DC component of the output of the MLL 1 also has a large intensity. In addition, since the low frequency noise has a low slew rate, it has a property of being likely to cause jitter in the clock signal.

As described above, in the example, it is possible to reduce jitter of the clock signal by removing the low frequency noise in the vicinity of the DC component of the output of the MLL 1.

Second Example

Figure 4:
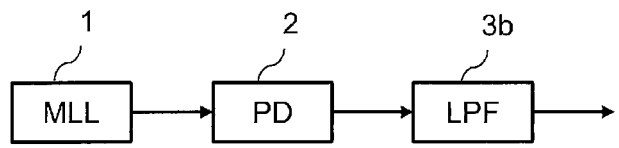
FIG. 4 is a block diagram showing a configuration of a clock generation circuit according to a second example of the present invention.

Next, a second example of the present invention will be described. FIG. 4 is a block diagram showing a configuration of a clock generation circuit according to the second example of the present invention, and the same configuration as in FIG. 3 is given the same reference sign. The clock generation circuit of the example includes an MLL 1, a PD 2, and a low-pass filter (LPF) 3b that low-pass filters an electric pulse output from the PD 2.

In the example, a cutoff frequency of the LPF 3b is set to a repetition frequency of the MLL 1 so that a harmonic component included in the output of the MLL 1 is not superimposed on a clock signal output from the LPF 3b.

The output of the MLL 1 is short pulse light. The short pulse light is composed of a DC component, a repetition frequency component, and a large number of harmonic components on the frequency axis. In the case of an MLL, 100th to 1000th harmonic components may be generated. That is, majority of intensity of the short pulse light output from the MLL 1 is the harmonic components. Since the intensity of the entire harmonics is strong, when a phase noise is generated in high frequencies in the vicinity of the harmonic components, intensity of this noise also becomes strong.

In the example, it is possible to reduce jitter of the clock signal by removing the noise in the vicinity of the harmonic components of the output of the MLL 1.

Third Example

Figure 5:
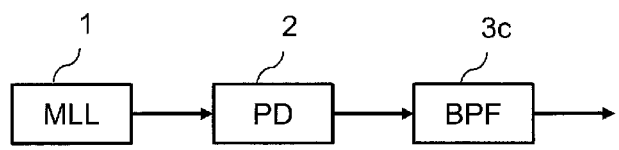
FIG. 5 is a block diagram showing a configuration of a clock generation circuit according to a third example of the present invention.

Next, a third example of the present invention will be described. FIG. 5 is a block diagram showing a configuration of a clock generation circuit according to the third example of the present invention, and the same configuration as in FIGS. 3 and 4 is given the same reference sign. The clock generation circuit of the example includes an MLL 1, a PD 2, and a band-pass filter (BPF) 3c that narrow-band filters an electric pulse output from the PD 2.

In the example, a center frequency of a passband of the BPF 3c is set to a repetition frequency of the MLL 1 so that only the repetition frequency component and a frequency component in the vicinity pass through the BPF 3c, and a DC component and a harmonic component included in the output of the MLL 1 are not superimposed on a clock signal output from the BPF 3c.

In this way, this example can obtain both effects of the first example and the second example.

Fourth Example

Figure 6:
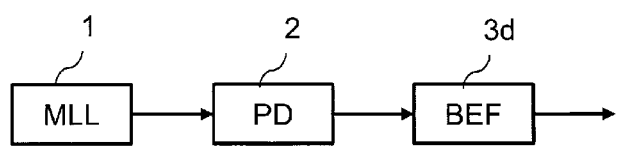
FIG. 6 is a block diagram showing a configuration of a clock generation circuit according to a fourth example of the present invention.

Next, a fourth example of the present invention will be described. FIG. 6 is a block diagram showing a configuration of a clock generation circuit according to the fourth example of the present invention, and the same configuration as in FIGS. 3-5 is given the same reference sign. The clock generation circuit of the example includes an MLL 1, a PD 2, and a band elimination filter (BEF) 3d that attenuates a DC component and a harmonic component included in an output of the PD 2.

In the example, a center frequency of an attenuation band on a lower band side of the BEF 3d is set to a frequency of a DC component of the MLL 1 and a center frequency of an attenuation band on a higher band side is set to a frequency of a harmonic component of the MLL 1 so that the DC component and the harmonic component included in the output of the MLL 1 are not superimposed on a clock signal output from the BEF 3d.

In this way, in the example, it is possible to reduce jitter of the clock signal by strongly attenuating the noise component.

Fifth Example

Figure 7:
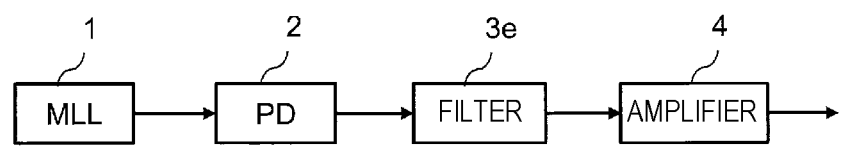
FIG. 7 is a block diagram showing a configuration of a clock generation circuit according to a fifth example of the present invention.

Next, a fifth example of the present invention will be described. FIG. 7 is a block diagram showing a configuration of a clock generation circuit according to the fifth example of the present invention, and the same configuration as in FIGS. 3-6 is given the same reference sign. The clock generation circuit of the example includes an MLL 1, a PD 2, a filter 3e that removes a DC component and a harmonic component of the MLL 1 included in an output of the PD 2, and an amplifier 4 that amplifies a clock signal output from the filter 3.

As the filter 3e, the BPF 3c of the third example or the BEF 3d of the fourth example can be used. An unnecessary frequency component is removed with the filter 3e so that an output of the filter 3e becomes a sine wave clock signal.

The sine wave clock signal is amplified with the broadband amplifier 4. The amplifier 4 is a voltage amplification amplifier or a trans-impedance amplifier. When the output of the PD 2 is a voltage signal, the voltage amplification amplifier is used, whereas when the output of the PD 2 is a current signal, the trans-impedance amplifier is used.

In the example, the filter 3e attenuates a noise amplitude and the amplifier 4 amplifies a signal amplitude of a repetition frequency of the MLL 1 so that a slew rate of a clock signal output from the amplifier 4 can be increased. As explained in Formula (3), jitter of the clock signal can be roughly estimated from the slew rate THR of the clock signal and the noise amplitude $V_{Npp}$. In the example, it is possible to further reduce jitter in the clock signal by increasing the slew rate of the clock signal as compared with the case where only the filter is used as in the first to fourth examples.

Sixth Example

Figure 8:
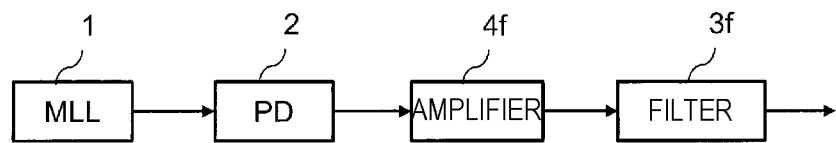
FIG. 8 is a block diagram showing a configuration of a clock generation circuit according to a sixth example of the present invention.

Next, a sixth example of the present invention will be described. FIG. 8 is a block diagram showing a configuration of a clock generation circuit according to the sixth example of the present invention, and the same configuration as in FIGS. 3-7 is given the same reference sign. The clock generation circuit of the example includes an MLL 1, a PD 2, an amplifier 4f that amplifies an output signal of the PD 2, and a filter 3f that removes a DC component and a harmonic component of the MLL 1 included in an output of the amplifier 4f.

In the example, the output signal of the PD 2 is amplified with the broadband amplifier 4f. As in the fifth example, when the output of the PD 2 is a voltage signal, a voltage amplification amplifier is used, whereas when the output of the PD 2 is a current signal, a trans-impedance amplifier is used.

As the filter 3f, the BPF 3c of the third example or the BEF 3d of the fourth example can be used. An unnecessary frequency component other than a repetition frequency of the MLL 1 is removed with the filter 3f so that an output of the filter 3f becomes a sine wave clock signal.

In the example, in addition to the effect of the fifth example, an effect of being able to remove a thermal noise, a 1/f noise, or the like generated in the amplifier 4f is achieved by connecting the filter 3f at a subsequent stage of the amplifier 4f.

Seventh Example

Figure 9:
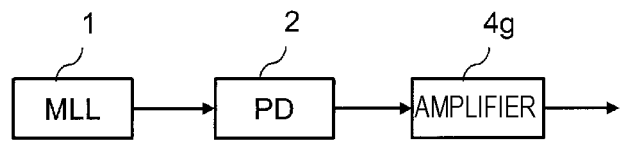
FIG. 9 is a block diagram showing a configuration of a clock generation circuit according to a seventh example of the present invention.

Next, a seventh example of the present invention will be described. FIG. 9 is a block diagram showing a configuration of a clock generation circuit according to the seventh example of the present invention, and the same configuration as in FIGS. 3-8 is given the same reference sign. The clock generation circuit of the example includes an MLL 1, a PD 2, and a narrow-band amplifier 4g that amplifies an output signal of the PD 2.

In the example, a center frequency of a frequency band of the amplifier 4g is set to a repetition frequency of the MLL 1 so that a cutoff frequency of a lower band side of the amplifier 4g is set higher than a frequency of a DC component of the MLL 1 included in an output of the PD 2 and a cutoff frequency of a higher band side of the amplifier 4g is set lower than a frequency of a harmonic component of the MLL 1 included in the output of the PD 2. Thereby, a frequency characteristic of the amplifier 4g can be set so that only the repetition frequency component is amplified and an unnecessary frequency component is attenuated.

Figure 10:
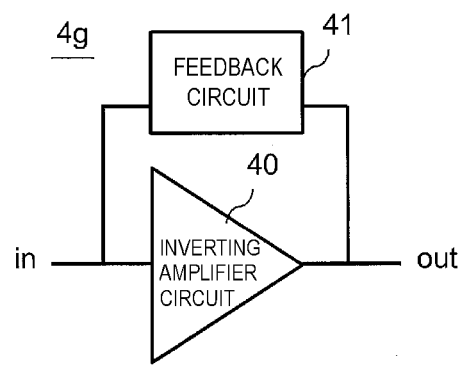
FIG. 10 is a block diagram showing an outline of a configuration of an amplifier according to the seventh example of the present invention.

FIG. 10 shows an outline of a configuration of the amplifier 4g. The amplifier 4g includes an inverting amplifier circuit 40, and a feedback circuit 41 inserted between an input terminal and an output terminal of the inverting amplifier circuit 40. As the inverting amplifier circuit 40, an operational amplifier may be used, or an amplifier circuit including a transistor, as shown in any of FIGS. 11(A)-11(C) may be used.

Figure 11:
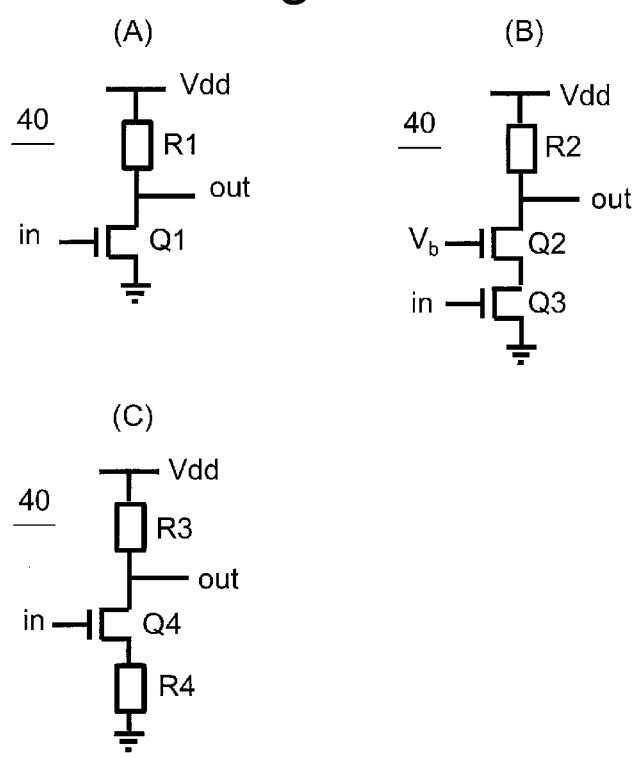
FIG. 11 is a circuit diagram showing a configuration example of an inverting amplifier circuit according to the seventh example of the present invention.

A circuit shown in FIG. 11(A) is a source-grounded amplifier circuit composed of a transistor Q1 having a gate that receives an input signal in, a source that is grounded, and a drain that outputs an output signal out, and a load resistor R1 having one end connected to a drive voltage Vdd and the other end connected to the drain of the transistor Q1.

A circuit shown in FIG. 11(B) is a cascaded amplifier circuit composed of a transistor Q2 having a gate that receives a bias voltage $V_b$ and a drain that outputs the output signal out, a transistor Q3 having a gate that receives the input signal in, a source that is grounded, and a drain that is connected to a source of the transistor Q2, and a load resistor R2 having one end connected to the drive voltage Vdd and the other end connected to the drain of the transistor Q2.

A circuit shown in FIG. 11(C) is a degeneration amplifier circuit composed of a transistor Q4 having a gate that receives the input signal in and a drain that outputs the output signal out, a load resistor R3 having one end connected to the drive voltage Vdd and the other end connected to the drain of the transistor Q4, and a load resistor R4 having one end connected to a source of the transistor Q4 and the other end that is grounded.

Figure 12:
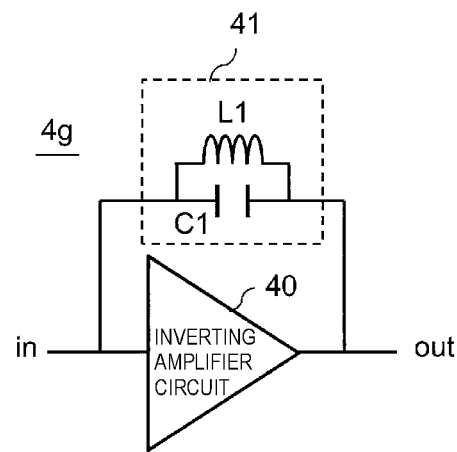
FIG. 12 is a circuit diagram showing a configuration example of a feedback circuit according to the seventh example of the present invention.

FIG. 12 is a circuit diagram showing a configuration example of a feedback circuit 41. In an example of FIG. 12, a feedback circuit 41 is composed of a parallel circuit of an inductor L1 and a capacitor C1. Note that the feedback circuit 41 may have a configuration including a resistor.

In the example, since an SN ratio improves by using the narrow-band amplifier 4g, jitter of a clock signal output from the amplifier 4g can be reduced. The amplifier 4g has a smaller output noise amplitude as compared with a broadband amplifier, it can output a clock signal with little jitter. Since the amplifier 4g with the feedback circuit 41 can lower an input converted noise by increasing impedance of the feedback circuit 41, an output noise amplitude can be lowered compared with an amplifier without a feedback circuit.

Eighth Example

Figure 13:
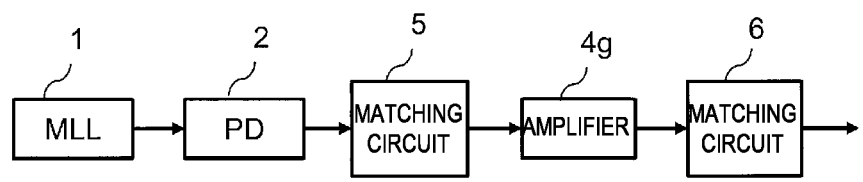
FIG. 13 is a block diagram showing a configuration of a clock generation circuit according to an eighth example of the present invention.

Next, an eighth example of the present invention will be described. FIG. 13 is a block diagram showing a configuration of a clock generation circuit according to the eighth example of the present invention, and the same configuration as in FIGS. 3-9 is given the same reference sign. The clock generation circuit of the example includes an MLL 1, a PD 2, a narrow-band amplifier 4g, a matching circuit 5 that is inserted between an output terminal of the PD 2 and an input terminal of the amplifier 4g and matches impedance of the PD 2 and the amplifier 4g at a repetition frequency of the MLL 1, and a matching circuit 6 that is inserted between an output terminal of the amplifier 4g and an input terminal of a subsequent circuit (not shown) connected to the amplifier 4g and matches impedance of the amplifier 4g and the subsequent circuit (having an impedance of, for example, 50Ω) at the repetition frequency of the MLL 1.

An example of the matching circuits 5 and 6 includes an LC ladder circuit in which inductors and capacitors are connected in a ladder shape.

As in the seventh example, in this example, by using the narrow-band amplifier 4g, only the repetition frequency component of the MLL 1 is amplified and unnecessary frequency components (DC component and harmonic component of the MLL 1) can be attenuated.

In the example, the matching circuit 5 on the input side reflects the unnecessary frequency components input from the PD 2.

Furthermore, in the example, the matching circuit 6 on the output side reflects the unnecessary frequency components reflected by the subsequent circuit.

As described above, in the example, since an SN ratio improves by using the narrow-band amplifier 4g, jitter of a clock signal output from the amplifier 4g can be reduced. Since the amplifier 4g has a smaller output noise amplitude as compared with a broadband amplifier, it can output a clock signal with little jitter.

In the example, since the matching circuits 5 and 6 reflect the unnecessary frequency components, a signal output from the amplifier 4g to the subsequent circuit includes only a clock signal of the repetition frequency of the MLL 1, and jitter of the clock signal can be reduced. In the example, the clock generation circuit can be driven with the maximum available power gain by the matching circuits 5 and 6, and the SN ratio of the output is improved so that jitter can be reduced. In the example, as a design guideline, necessity to minimize an NF (Noise Figure) is mitigated, so it is not necessary to use, for example, a low noise amplifier in which source reactance is added to an amplifier, and circuit area can be reduced.

Ninth Example

Figure 14:
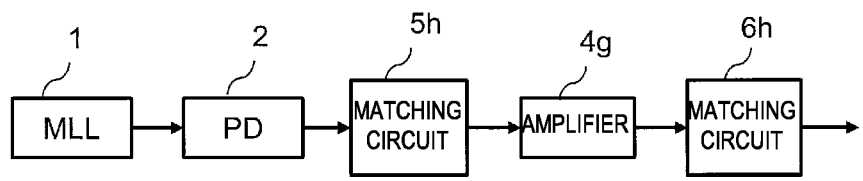
FIG. 14 is a block diagram showing a configuration of a clock generation circuit according to a ninth example of the present invention.

Next, a ninth example of the present invention will be described. FIG. 14 is a block diagram showing a configuration of a clock generation circuit according to the ninth example of the present invention, and the same configuration as in FIGS. 3-9 and 13 is given the same reference sign. The clock generation circuit of the example includes an MLL 1, a PD 2, a narrow-band amplifier 4g, a matching circuit 5h inserted between an output terminal of the PD 2 and an input terminal of the amplifier 4g, and a matching circuit 6h inserted between an output terminal of the amplifier 4g and an input terminal of a subsequent circuit (not shown) connected to the amplifier 4g.

Figure 15:
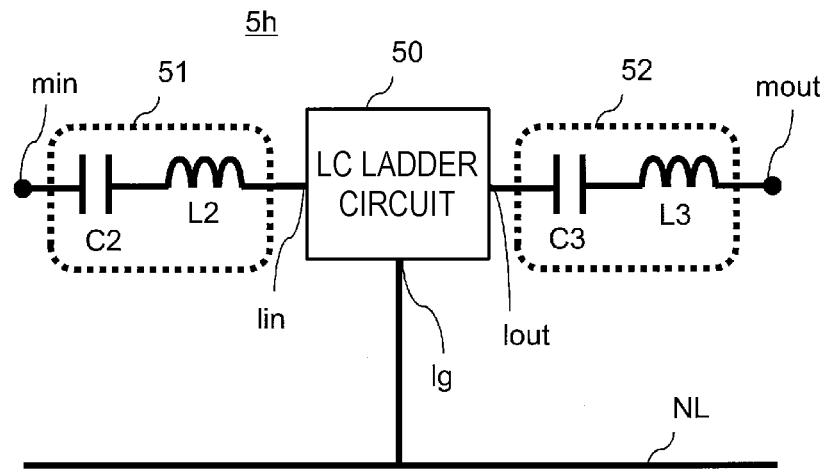
FIG. 15 is a block diagram showing a configuration example of a matching circuit according to the ninth example of the present invention.

FIG. 15 is a block diagram showing a configuration example of the matching circuit 5h. The matching circuit 5h includes an LC ladder circuit 50 in which inductors and capacitors are connected in a ladder shape, a series resonator 51 composed of an inductor L2 and a capacitor C2 inserted between an input terminal min of the matching circuit 5h and an input terminal lin of the LC ladder circuit 50, and a series resonator 52 composed of an inductor L3 and a capacitor C3 inserted between an output terminal lout of the LC ladder circuit 50 and an output terminal mout of the matching circuit 5h. In FIG. 15, description is made taking the matching circuit 5h as an example, but a configuration of the matching circuit 6h is the same as that of the matching circuit 5h.

As in the eighth example, the matching circuit 5h matches impedance of the PD 2 and the amplifier 4g at a repetition frequency of the MLL 1. The matching circuit 6h matches impedance of the amplifier 4g and the subsequent circuit at the repetition frequency of the MLL 1.

In the example, the series resonators 51 and 52 are inserted before and after the general LC ladder circuit 50, respectively, in each of the matching circuits 5h and 6h, and thereby unnecessary frequency components can be more strongly attenuated than the matching circuits 5 and 6 of the eighth example. The series resonators 51 and 52 reduce impedance at respective resonance frequencies and increase impedance at other frequencies. Consequently, signals of the resonance frequencies can pass through the series resonators 51 and 52, but signals of the other frequencies hardly pass through the series resonators 51 and 52.

When the series resonators 51 and 52 are inserted in series into a signal line from the input terminal min to the output terminal mout as in the example, the resonance frequencies of the series resonators 51 and 52 are set to the repetition frequency of the MLL 1. This makes the matching circuits 5h and 6h into circuits that pass only a signal of the repetition frequency and strongly attenuate signals of the other frequencies.

Figure 16:
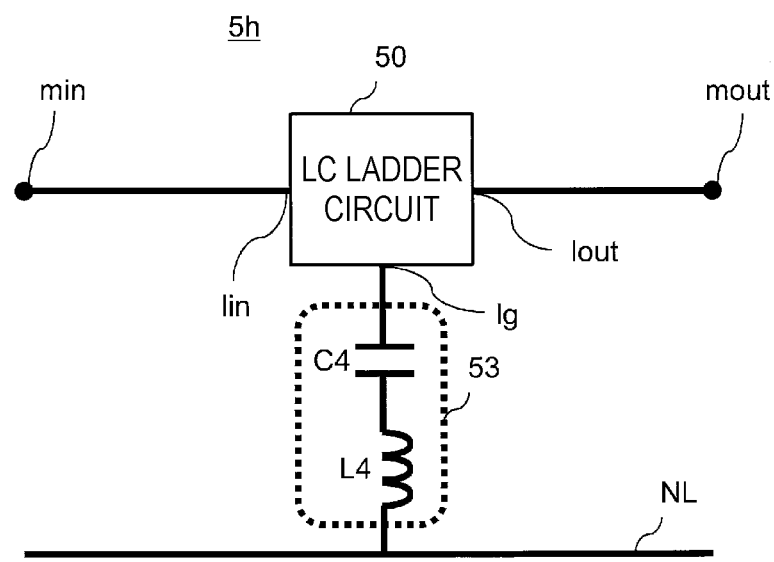
FIG. 16 is a block diagram showing another configuration example of the matching circuit according to the ninth example of the present invention.

The matching circuit 5h may have a configuration as shown in FIG. 16. In this case, the matching circuit 5h includes the LC ladder circuit 50 and a series resonator 53 composed of an inductor L4 and a capacitor C4 inserted between a ground terminal 1g of the LC ladder circuit 50 and a negative power supply line NL. In FIG. 16, description is made taking the matching circuit 5h as an example, but the configuration of the matching circuit 6h is the same as that of the matching circuit 5h.

As shown in FIG. 16, in the case where the series resonator 53 is inserted between the signal line and the negative power supply line NL in each of the matching circuits 5h and 6h, the resonance frequency of the series resonator 53 is set to a frequency of a harmonic component of the MLL 1. This makes the matching circuits 5h and 6h into circuits that let the harmonic component of the MLL 1 escape to the low-impedance negative power supply line NL and remove a noise component.

As described above, this example can more strongly attenuate unnecessary frequency components than the eighth example. When the PD 2 outputs current, DC current is input into a MOS transistor included in the amplifier 4g and may destroy it, but according to the example, such destruction of the MOS transistor can be avoided.

A Q value of resonance can be controlled by serially connecting a resistor to each of the series resonators 51-53, and passbands and attenuation bands of the series resonators 51-53 can be adjusted.

In this example, although the examples in which either the series resonators 51 and 52 or the series resonator 53 is provided are described, the series resonators 51 and 52 and the series resonator 53 may be simultaneously provided in each of the matching circuits 5h and 6h.

Tenth Example

Figure 17:
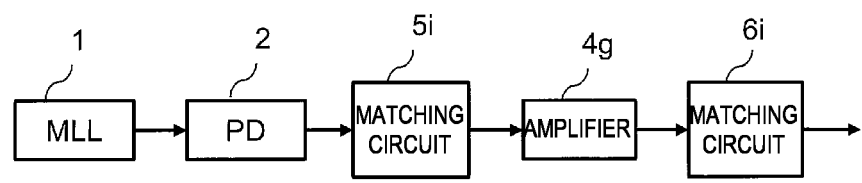
FIG. 17 is a block diagram showing a configuration of a clock generation circuit according to a tenth example of the present invention.

Next, a tenth example of the present invention will be described. FIG. 17 is a block diagram showing a configuration of a clock generation circuit according to the tenth example of the present invention, and the same configuration as in FIGS. 3-9, 13, and 14 is given the same reference sign. The clock generation circuit of the example includes an MLL 1, a PD 2, a narrow-band amplifier 4g, a matching circuit 5i inserted between an output terminal of the PD 2 and an input terminal of the amplifier 4g, and a matching circuit 6i inserted between an output terminal of the amplifier 4g and an input terminal of a subsequent circuit (not shown) connected to the amplifier 4g.

Figure 18:
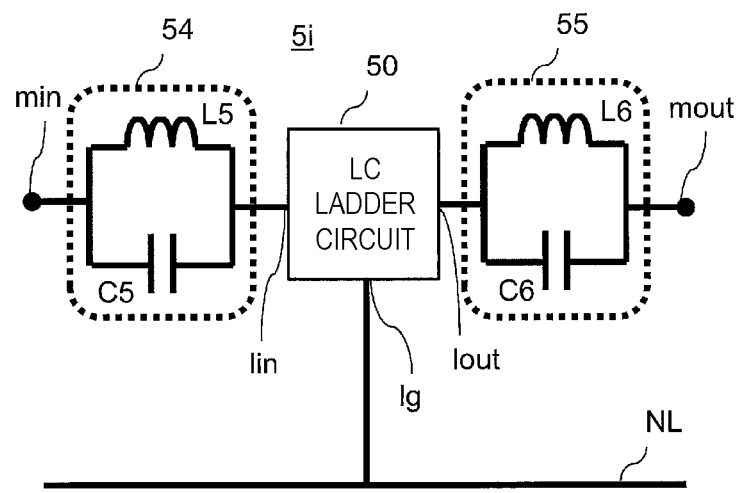
FIG. 18 is a block diagram showing a configuration example of a matching circuit according to the tenth example of the present invention.

FIG. 18 is a block diagram showing a configuration example of the matching circuit 5i. The matching circuit 5i includes an LC ladder circuit 50, a parallel resonator 54 composed of an inductor L5 and a capacitor C5 inserted between an input terminal min of the matching circuit 5i and an input terminal lin of the LC ladder circuit 50, and a parallel resonator 56 composed of an inductor L6 and a capacitor C6 inserted between an output terminal lout of the LC ladder circuit 50 and an output terminal mout of the matching circuit 5i. In FIG. 18, description is made taking the matching circuit 5i as an example, but a configuration of the matching circuit 6i is the same as that of the matching circuit 5i.

As in the eighth example, the matching circuit 5i matches impedance of the PD 2 and the amplifier 4g at a repetition frequency of the MLL 1. The matching circuit 6i matches impedance of the amplifier 4g and the subsequent circuit at the repetition frequency of the MLL 1.

In the example, the parallel resonators 54 and 55 are inserted before and after the general LC ladder circuit 50, respectively, in each of the matching circuits 5i and 6i, and thereby unnecessary frequency components can be more strongly attenuated than the matching circuits 5 and 6 of the eighth example. The parallel resonators 54 and 55 increase impedance at respective resonance frequencies and exponentially reduce impedance at other frequencies. Consequently, signals of the resonance frequencies hardly pass through the parallel resonators 54 and 55, but signals of the other frequencies can pass through the parallel resonators 54 and 55.

When the parallel resonators 54 and 55 are inserted in series into a signal line from the input terminal min to the output terminal mout as in the example, the resonance frequencies of the parallel resonators 54 and 55 are set to any of a frequency of a DC component and a frequency of a harmonic component of the MLL 1. This makes the matching circuits 5i and 6i into circuits that pass a signal of a repetition frequency and strongly attenuate any of the DC component and the harmonic component of the MLL 1.

Figure 19:
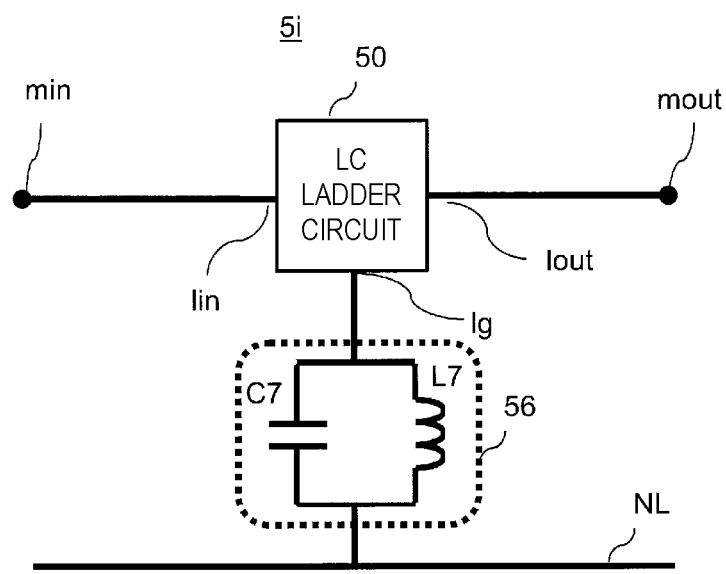
FIG. 19 is a block diagram showing another configuration example of the matching circuit according to the tenth example of the present invention.

The matching circuit 5i may have a configuration as shown in FIG. 19. In this case, the matching circuit 5i includes the LC ladder circuit 50 and a parallel resonator 56 composed of an inductor L7 and a capacitor C7 inserted between a ground terminal 1g of the LC ladder circuit 50 and a negative power supply line NL. In FIG. 19, description is made taking the matching circuit 5i as an example, but a configuration of the matching circuit 6i is the same as that of the matching circuit 5i.

As shown in FIG. 19, in the case where the parallel resonator 56 is inserted between the signal line and the negative power supply line NL in each of the matching circuits 5i and 6i, the resonance frequency of the parallel resonator 56 is set to the repetition frequency of the MLL 1. This makes the matching circuits 5i and 6i into circuits that let the DC component and the harmonic component of the MLL 1 escape to the low-impedance negative power supply line NL and remove a noise component.

As described above, the example can more strongly attenuate unnecessary frequency components than the eighth example. When the PD 2 outputs current, DC current is input into a MOS transistor included in the amplifier 4g and may destroy it, but according to the example, such destruction of the MOS transistor can be avoided.

A Q value of resonance can be controlled by connecting a resistor in parallel with each of the parallel resonators 54-56, and passbands and attenuation bands of the parallel resonators 54-56 can be adjusted.

In this example, although the examples in which either the parallel resonators 54 and 55 or the parallel resonator 56 is provided are described, the parallel resonators 54 and 55 and the parallel resonator 56 may be simultaneously provided in each of the matching circuits 5i and 6i.

Eleventh Example

Figure 20:
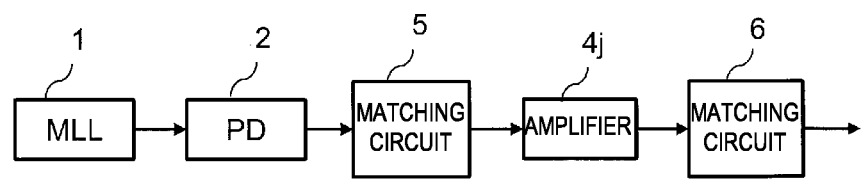
FIG. 20 is a block diagram showing a configuration of a clock generation circuit according to an eleventh example of the present invention.

Next, an eleventh example of the present invention will be described. FIG. 20 is a block diagram showing a configuration of a clock generation circuit according to the eleventh example of the present invention, and the same configuration as in FIGS. 3-9, 13, 14, and 17 is given the same reference sign. The clock generation circuit of the example includes an MLL 1, a PD 2, a narrow-band amplifier 4j, and matching circuits 5 and 6.

In the example, as in the seventh example, a center frequency of a band of the amplifier 4j is set to a repetition frequency of the MLL 1 so that a cutoff frequency of a lower band side of the amplifier 4j is set higher than a frequency of a DC component of the MLL 1 included in an output of the PD 2 and a cutoff frequency of a higher band side of the amplifier 4j is set lower than a frequency of a harmonic component of the MLL 1 included in the output of the PD 2.

When the amplifier 4j includes a transistor (such as a NMOS transistor) that operates in a depletion mode, a bias voltage may be needed. The bias voltage is usually input from a positive power supply line via a resistor. In the example, the resistor is replaced with a parallel resonator.

Figure 21:
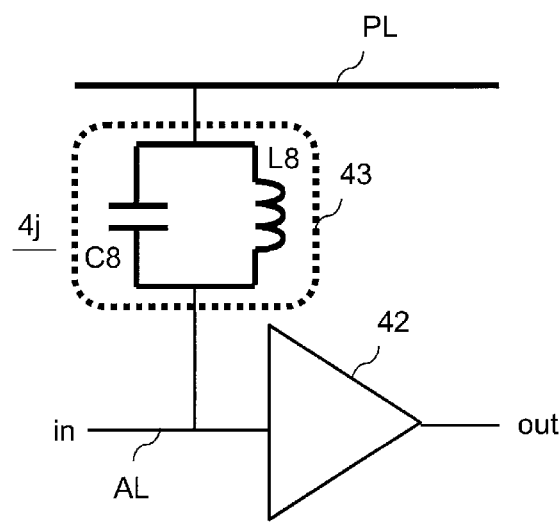
FIG. 21 is a block diagram showing a configuration example of an amplifier according to the eleventh example of the present invention.

FIG. 21 is a block diagram showing a configuration example of the amplifier 4j of the example. The amplifier 4j includes a narrow-band amplifier 42 having the same configuration as the amplifier 4g of the seventh example, and a parallel resonator 43 composed of an inductor L8 and a capacitor C8 inserted between a positive power supply line PL and an input signal line AL of the amplifier 42.

The parallel resonator 43 increases impedance at a resonance frequency and reduces impedance at other frequencies. Therefore, in the example, the resonance frequency of the parallel resonator 43 is set to the repetition frequency of the MLL 1. This makes the parallel resonator 43 into a circuit that lets frequency components other than the repetition frequency of the MLL 1 escape the low-impedance positive power supply line PL and removes a noise component.

As described above, this example can more strongly attenuate unnecessary frequency components than the eighth example. When the PD 2 outputs current, DC current is input into a MOS transistor included in the amplifier 4j and may destroy it, but according to the example, such destruction of the MOS transistor can be avoided.

When a resistor is used to supply a bias voltage to the amplifier 42, the resistor generates a thermal noise. Since the parallel resonator 43 is used instead of the resistor for supplying the bias voltage in the example, the thermal noise due to the resistor can be eliminated and jitter of a clock signal output from the amplifier 4j can be reduced.

A Q value of resonance can be controlled by connecting a resistor in parallel with the parallel resonator 43, and a passband and an attenuation band of the parallel resonator 43 can be adjusted. In addition, this example and the eleventh example may be used simultaneously.

Twelfth Example

Figure 22:
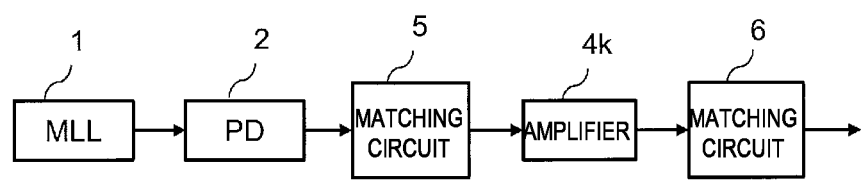
FIG. 22 is a block diagram showing a configuration of a clock generation circuit according to a twelfth example of the present invention.

Next, a twelfth example of the present invention will be described. FIG. 22 is a block diagram showing a configuration of a clock generation circuit according to the twelfth example of the present invention, and the same configuration as in FIGS. 3-9, 13, 14, 17, and 20 is given the same reference sign. The clock generation circuit of the example includes an MLL 1, a PD 2, a narrow-band amplifier 4k, and matching circuits 5 and 6.

In this example, as in the seventh example, a center frequency of a band of the amplifier 4k is set to a repetition frequency of the MLL 1 so that a cutoff frequency of a lower band side of the amplifier 4k is set higher than a frequency of a DC component of the MLL 1 included in an output of the PD 2 and a cutoff frequency of a higher band side of the amplifier 4k is set lower than a frequency of a harmonic component of the MLL 1 included in the output of the PD 2.

Figure 23:
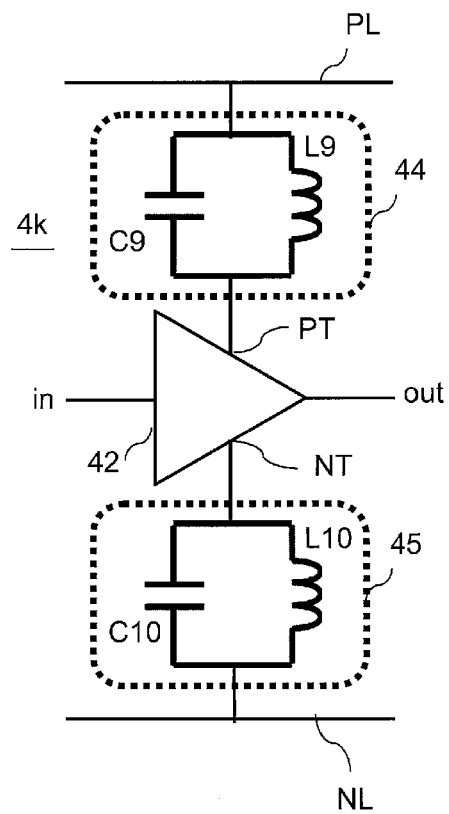
FIG. 23 is a block diagram showing a configuration example of an amplifier according to the twelfth example of the present invention.

FIG. 23 is a block diagram showing a configuration example of the amplifier 4k of the example. The amplifier 4k includes a narrow-band amplifier 42 having the same configuration as the amplifier 4g of the seventh example, a parallel resonator 44 composed of an inductor L9 and a capacitor C9 inserted between a positive power supply line PL and a positive power supply terminal PT of the amplifier 42, and a parallel resonator 45 composed of an inductor L10 and a capacitor C10 inserted between a negative power supply terminal NT of the amplifier 42 and a negative power supply line NL.

The parallel resonators 44 and 45 increase impedance at respective resonance frequencies and exponentially reduce impedance at other frequencies. Therefore, in the example, the resonance frequencies of the parallel resonators 44 and 45 are set to the frequency of the harmonic component of the MLL 1. When the amplifier 42 composed of a source-grounded amplifier circuit or the like amplifies a signal, current flows from the positive power supply line PL to the negative power supply line NL. When the parallel resonators 44 and 45 are provided as in the example, current does not flow at the frequency of the harmonic component, and gain of the amplifier 42 decreases. Thereby, the harmonic component can be attenuated.

As described above, this example can more strongly attenuate unnecessary frequency components than the eighth example.

A Q value of resonance can be controlled by connecting a resistor in parallel with each of the parallel resonators 44 and 45, and passbands and attenuation bands of the parallel resonators 44 and 45 can be adjusted.

In addition, in this example, although the example in which both parallel resonators 44 and 45 are provided is described, only any one of the parallel resonators 44 and 45 may be provided.

Thirteenth Example

Figure 24:
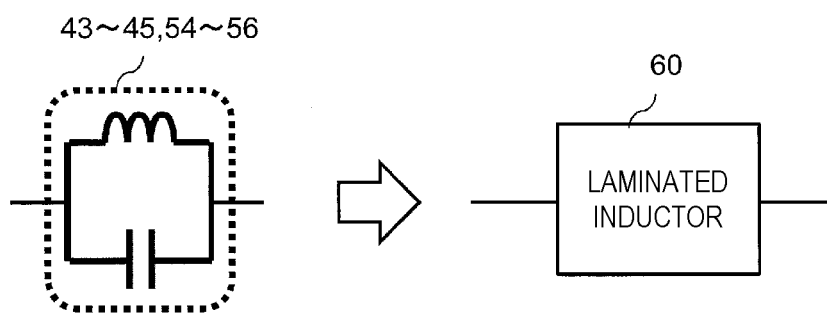
FIG. 24 is a diagram illustrating an outline of a thirteenth example of the present invention.

In the tenth to twelfth examples, a parallel circuit composed of an inductor and a capacitor is used as the parallel resonators 43-45 and 54-56. In this example, the parallel resonators 43-45 and 54-56 are replaced with a laminated inductor 60 (FIG. 24).

Figure 25:
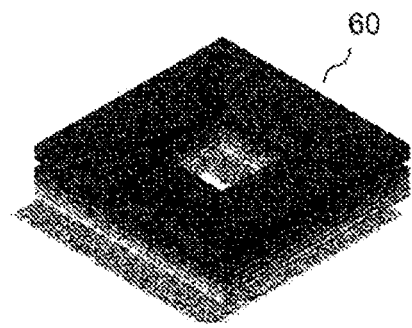
FIG. 25 is an external view of a laminated inductor according to the thirteenth example of the present invention.
Figure 26:
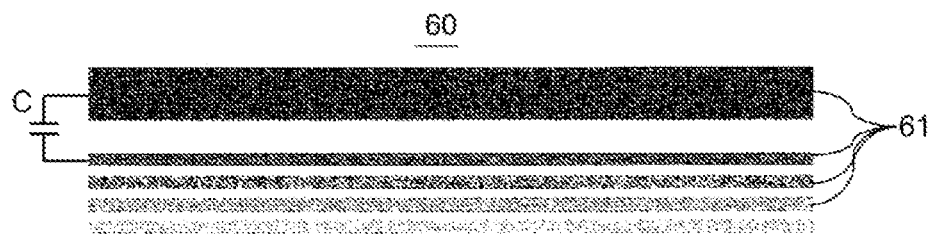
FIG. 26 is a diagram illustrating a principle of generating a capacitive component in the laminated inductor.

As shown in FIG. 25, the laminated inductor 60 has a quadrangular shape in plan view, a hexagonal shape in plan view, an octagonal shape in plan view, a circular shape in plan view, or an elliptical shape in plan view, and is an object in which a plurality of annular metal wires are laminated and the metal wires of respective layers are connected by a via. In such a laminated inductor 60, a capacitance C is generated between the metal wires 61 of the respective layers as shown in FIG. 26.

Consequently, an equivalent circuit of the laminated inductor 60 has a configuration in which the capacitance C is inserted in parallel with an original inductor and has a resonance frequency. That is, the laminated inductor 60 increases impedance at the resonance frequency so the parallel resonators 43-45 and 54-56 in the tenth to twelfth examples can be replaced with the laminated inductor 60.

Since a self-induction action is added when an inductor is formed with metal of a single layer, the laminated inductor 60 has a large induction amount per area. Therefore, if the parallel resonators 43-45 and 54-56 of the tenth to twelfth examples are replaced with the laminated inductor 60, space saving implementation is possible.

When the parallel resonators 43-45 and 54-56 are manufactured each from an inductor and a capacitor as in the tenth to twelfth examples, a circuit cannot be formed on an upper layer of the capacitor due to a design rule. As a result, in the tenth to twelfth examples, the inductor and the capacitor are required to be arranged side by side in a planar manner and area efficiency is poor. On the other hand, in the laminated inductor 60 of the example, since the inductor and the capacitor are integrated, it can be implemented with good area efficiency.

The parallel resonators 43-45 and 54-56 composed of the inductor and the capacitor have a small resistance value and can achieve parallel resonance with a high Q. However, because of the high Q value, they may be a cause of oscillation. In addition, it becomes difficult to operate a broadband bandpass eliminate.

On the other hand, in the laminated inductor 60 of this example, since the metal wires of the respective layers are connected by a structure having a high resistance value called via, it is possible to form a parallel resonator having a low Q value without an additional resistor. Thereby, in the example, the freedom of band restriction is increased and space saving implementation becomes possible.

Fourteenth Example

Figure 27:
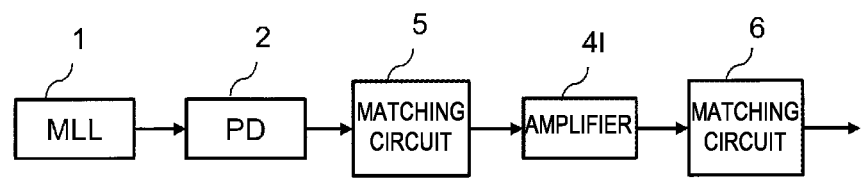
FIG. 27 is a block diagram showing a configuration of a clock generation circuit according to a fourteenth example of the present invention.

Next, a fourteenth example of the present invention will be described. FIG. 27 is a block diagram showing a configuration of a clock generation circuit according to the fourteenth example of the present invention, and the same configuration as in FIGS. 3-9, 13, 14, 17, 20, and 22 is given the same reference sign. The clock generation circuit of the example includes an MLL 1, a PD 2, a narrow-band amplifier 4*l*, and matching circuits 5 and 6.

The amplifier 4*g* of the seventh to eleventh examples, the amplifier 4*j* of the eleventh example, and the amplifier 4*k* of the twelfth example amplify a signal by mutual conductance by the transistor and the load resistor. On the other hand, the amplifier 4*l* of this example is provided with an element having an impedance that changes by a frequency rather than the load resistor.

Figure 28:
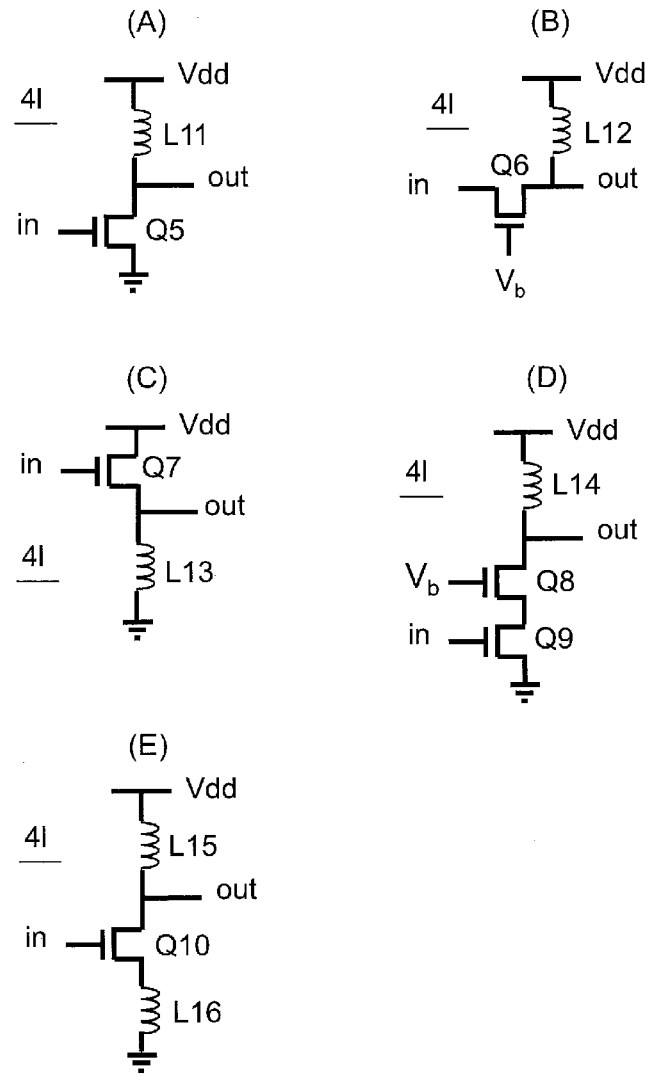
FIG. 28 is a circuit diagram showing a configuration example of an amplifier according to the fourteenth example of the present invention.
Figure 29:
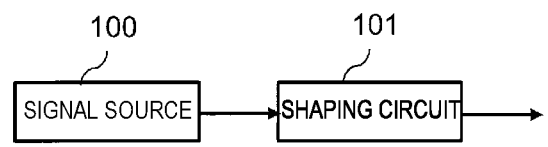
FIG. 29 is a block diagram showing a configuration of a conventional clock generation circuit.
Figure 30:
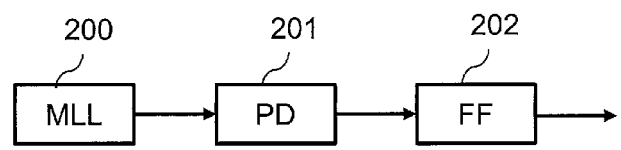
FIG. 30 is a block diagram showing another configuration of the conventional clock generation circuit.

FIGS. 28(A) to 28(E) are circuit diagrams showing configuration examples of the amplifier 4*l*. A circuit shown in FIG. 28(A) is a source-grounded amplifier circuit composed of a transistor Q5 having a gate that receives an input signal in, a source that is grounded, and a drain that outputs an output signal out, and an inductor L11 having one end connected to a drive voltage Vdd and the other end connected to the drain of the transistor Q5. In the source-grounded amplifier circuit, peaking occurs in a frequency characteristic by the inserted inductor L11 and a gate-drain parasitic capacitance of the transistor Q5.

In the example, a frequency at which peaking occurs is set to fc by adjusting inductance of the inductor L11 and thereby the narrow-band amplifier 4*l* of the center frequency fc is formed. Therefore, if the center frequency fc is set to a repetition frequency of the MLL 1, a cutoff frequency of a lower band side of the amplifier 4*l* can be made higher than a frequency of a DC component of the MLL 1 included in an output of the PD 2 and a cutoff frequency of a higher band side of the amplifier 4*l* can be made lower than a frequency of a harmonic component of the MLL 1 included in the output of the PD 2.

The example is not limited to the configuration shown in FIG. 28(A). Some examples of amplifiers to which the example is applicable are shown in FIGS. 28(B) to 28(E). A circuit shown in FIG. 28(B) is a gate-grounded amplifier circuit composed of a transistor Q6 having a gate that receives a bias voltage $V_b$, a source that receives the input signal in, and a drain that outputs the output signal out, and an inductor L12 having one end connected to the drive voltage Vdd and the other end connected to the drain of the transistor Q6.

A circuit shown in FIG. 28(C) is a drain-grounded amplifier circuit composed of a transistor Q7 having a gate that receives the input signal in, a source that outputs the output signal out, and a drain that is connected to the drive voltage Vdd, and an inductor L13 having one end connected to the source of the transistor Q7 and the other end that is grounded.

A circuit shown in FIG. 28(D) is a cascaded amplifier circuit composed of a transistor Q8 having a gate that receives the bias voltage $V_b$ and a drain that outputs the output signal out, a transistor Q9 having a gate that receives the input signal in, a source that is grounded, and a drain that is connected to a source of the transistor Q8, and an inductor L14 having one end connected to the drive voltage Vdd and the other end connected to the drain of the transistor Q8.

A circuit shown in FIG. 28(E) is a degeneration amplifier circuit composed of a transistor Q10 having a gate that receives the input signal in and a drain that outputs the output signal out, an inductor L5 having one end connected to the drive voltage Vdd and the other end connected to the drain of the transistor Q10, and an inductor L16 having one end connected to a source of the transistor Q10 and the other end that is grounded.

In FIGS. 28(A) to 28(E), the inductors L11 to L16 are used as a frequency peaking circuit that uses a characteristic in which impedance changes by the frequency to make a frequency characteristic of the amplifier have a peaking characteristic, but the frequency peaking circuit is not limited to the inductor. Other examples of the frequency peaking circuit include an LC series circuit in which an inductor and a capacitor are connected in series, an LC parallel circuit in which an inductor and a capacitor are connected in parallel, or an LR series circuit in which an inductor and a resistor are connected in series.

The example can reduce an output noise amplitude of the amplifier 4*l*. The noise output from the amplifier 4*l* is called an output noise voltage Vn and expressed by the following formula from a bandwidth BW, an input converted noise In, and a gain $Z_T$.

Formula 3

$$Vn = \int^{BW} In \times Z_T df \quad (4)$$

In the example, attention is paid to a point at which the amplifier 4*l* needs to amplify only the repetition frequency fc of the MLL 1 in the clock generation circuit, and the amplifier 4*l* having a narrow-band and the center frequency fc is used. When the narrow-band amplifier 4*l* is used, it is understood that the output noise voltage Vn can be reduced because the integration range of Formula (4) is narrowed. The inductor, the capacitor, and the like consisting the frequency peaking circuit has a small thermal noise strength as compared with the resistor. Therefore, using the frequency peaking circuit instead of the load resistor can eliminate the thermal noise of the load resistor, and jitter of a clock signal output from the amplifier 4*l* can be reduced.

When the LR series circuit in which an inductor and a resistor are connected in series is used as the frequency peaking circuit, since a Q value of peaking can be controlled, the band of the amplifier 4*l* can be adjusted.

INDUSTRIAL APPLICABILITY

Embodiments of the present invention are applicable to the technique for generating a clock signal.

REFERENCE SIGNS LIST

1 Mode-locked laser
2 Photodiode
3, 3*a*-3*f* Filter
4, 4*f*-4*l*, 42 Amplifier
5, 5*h*, 5*i*, 6, 6*h*, 6*i* Matching circuit
40 Inverting amplifier circuit
41 Feedback circuit
50 LC ladder circuit
51-53 Series resonator
43-45, 54-56 Parallel resonator
60 Laminated inductor
Q1-Q10 Transistor
R1-R4 Resistor
C1-C10 Capacitor
L1-L16 Inductor.

The invention claimed is:

1. A clock generation circuit comprising:

a mode-locked laser that generates an optical pulse;

a photodetector that photoelectrically converts the optical pulse generated by the mode-locked laser into an electric clock signal, wherein the electric clock signal comprises a DC component and a harmonic component;

an amplifier that amplifies the electric clock signal output from the photodetector to reduce jitter in the electric clock signal, wherein a first cutoff frequency on a lower band side of the amplifier is higher than a frequency of the DC component of the electric clock signal output from the photodetector, and wherein a second cutoff frequency on a higher band side of the amplifier is lower than a frequency of the harmonic component of the electric clock signal output from the photodetector;

a first matching circuit between an output terminal of the photodetector and an input terminal of the amplifier, wherein the first matching circuit matches an impedance of the photodetector and the amplifier at a repetition frequency of the mode-locked laser;

a second matching circuit between an output terminal of the amplifier and an input terminal of a subsequent circuit connected to the amplifier, wherein the second matching circuit matches an impedance of the amplifier and the subsequent circuit at the repetition frequency of the mode-locked laser, wherein each of the first matching circuit and second matching circuits includes:

a first series resonator comprising a first series circuit composed of a first inductor and a first capacitor connected series in a signal line, wherein the first series resonator has a resonance frequency set to the repetition frequency of the mode-locked laser;

a second series resonator comprising a second series circuit composed of a second inductor and a second capacitor between the signal line and a negative power supply line, wherein the second series resonator has a resonance frequency set to the frequency of the harmonic component of the mode-locked laser;

a first parallel resonator comprising a first parallel circuit composed of a third inductor connected in series in the signal line and a third capacitor connected in parallel with the third inductor, wherein the first parallel resonator has a resonance frequency set to the frequency of the DC component or the frequency of the harmonic component of the mode-locked laser; or a second parallel resonator comprising a second parallel circuit composed of a fourth inductor between the signal line and the negative power supply line and a fourth capacitor connected in parallel with the fourth inductor, wherein the second parallel resonator has a resonance frequency set to the repetition frequency of the mode-locked laser.

2. The clock generation circuit according to claim 1, wherein the amplifier includes a frequency peaking circuit having a center frequency set to the repetition frequency of the mode-locked laser.

3. A clock generation circuit comprising:
a mode-locked laser that generates an optical pulse;
a photodetector that photoelectrically converts the optical pulse generated by the mode-locked laser into an electric clock signal, wherein the electric clock signal comprises a DC component and a harmonic component;
an amplifier that amplifies the electric clock signal output from the photodetector to reduce jitter in the electric clock signal, wherein a first cutoff frequency on a lower band side of the amplifier is higher than a frequency of the DC component of the electric clock signal output from the photodetector, and wherein a second cutoff frequency on a higher band side of the amplifier is lower than a frequency of the harmonic component of the electric clock signal output from the photodetector;
a first matching circuit between an output terminal of the photodetector and an input terminal of the amplifier, wherein the first matching circuit matches an impedance of the photodetector and the amplifier at a repetition frequency of the mode-locked laser;
a second matching circuit between an output terminal of the amplifier and an input terminal of a subsequent circuit connected to the amplifier, wherein the second matching circuit matches an impedance of the amplifier and the subsequent circuit at the repetition frequency of the mode-locked laser, wherein the amplifier comprises:
  a first parallel resonator comprising a first parallel circuit composed of a first inductor between a positive power supply line and an input signal line and a first capacitor connected in parallel with the first inductor, wherein the first parallel resonator has a resonance frequency set to the repetition frequency of the mode-locked laser;
  a second parallel resonator comprising a second parallel circuit composed of a second inductor between the positive power supply line and a positive power supply terminal of the amplifier and a second capacitor connected in parallel with the second inductor, wherein the second parallel resonator has a resonance frequency set to the frequency of the harmonic component of the mode-locked laser; or
  a third parallel resonator comprising a third parallel circuit composed of a third inductor between a negative power supply terminal of the amplifier and a negative power supply line and a third capacitor connected in parallel with the third inductor, wherein the third parallel resonator has a resonance frequency set to the frequency of the harmonic component of the mode-locked laser.

4. The clock generation circuit according to claim 3, wherein each of the first matching circuit and second matching circuits includes:
  a first resonator comprising a first laminated inductor, wherein the first resonator has a resonance frequency set to the frequency of the DC component or the frequency of the harmonic component of the mode-locked laser; or
  a second resonator comprising a second laminated inductor, wherein the second resonator has a resonance frequency set to the repetition frequency of the mode-locked laser.

5. A clock generation circuit comprising:
a mode-locked laser that generates an optical pulse;
a photodetector that photoelectrically converts the optical pulse generated by the mode-locked laser into an electric clock signal, wherein the electric clock signal comprises a DC component and a harmonic component;
an amplifier that amplifies the electric clock signal output from the photodetector to reduce jitter in the electric clock signal, wherein a first cutoff frequency on a lower band side of the amplifier is higher than a frequency of the DC component of the electric clock signal output from the photodetector, and wherein a second cutoff frequency on a higher band side of the amplifier is lower than a frequency of the harmonic component of the electric clock signal output from the photodetector;
a first matching circuit between an output terminal of the photodetector and an input terminal of the amplifier, wherein the first matching circuit matches an impedance of the photodetector and the amplifier at a repetition frequency of the mode-locked laser;
a second matching circuit between an output terminal of the amplifier and an input terminal of a subsequent circuit connected to the amplifier, wherein the second matching circuit matches an impedance of the amplifier and the subsequent circuit at the repetition frequency of the mode-locked laser, wherein the amplifier comprises:
  a first resonator comprising a first laminated inductor, wherein the first resonator has a resonance frequency set to the repetition frequency of the mode-locked laser;
  a second resonator comprising a second laminated inductor, wherein the second resonator has a resonance frequency set to the frequency of the harmonic component of the mode-locked laser; or
  a third resonator comprising a third laminated inductor, wherein the third resonator has a resonance frequency set to the frequency of the harmonic component of the mode-locked laser.

* * * * *